(12) United States Patent
Kobayashi et al.

(10) Patent No.: US 7,833,924 B2
(45) Date of Patent: Nov. 16, 2010

(54) YTTRIUM OXIDE-CONTAINING MATERIAL, COMPONENT OF SEMICONDUCTOR MANUFACTURING EQUIPMENT, AND METHOD OF PRODUCING YTTRIUM OXIDE-CONTAINING MATERIAL

(75) Inventors: Yoshimasa Kobayashi, Nagoya (JP); Yuji Katsuda, Tsushima (JP); Hiroaki Sakai, Nagoya (JP); Koichi Niihara, Nagaoka (JP); Tadachika Nakayama, Nagaoka (JP)

(73) Assignees: NGK Insulators, Ltd., Nagoya (JP); Nagaoka University of Technology, Nagaoka-Shi (JP)

(*) Notice: Subject to any disclaimer, the term of this patent is extended or adjusted under 35 U.S.C. 154(b) by 261 days.

(21) Appl. No.: 12/043,988

(22) Filed: Mar. 7, 2008

(65) Prior Publication Data

US 2008/0226894 A1 Sep. 18, 2008

(30) Foreign Application Priority Data

Mar. 12, 2007 (JP) ............................. 2007-062329
Feb. 27, 2008 (JP) ............................. 2008-046329

(51) Int. Cl.
C04B 35/505 (2006.01)
C04B 35/569 (2006.01)

(52) U.S. Cl. ......................................... 501/152; 501/88
(58) Field of Classification Search .................. None
See application file for complete search history.

(56) References Cited

U.S. PATENT DOCUMENTS 5,459,111 A * 10/1995 Yoshimura et al. ............ 501/88

| 7,371,704 | B2* | 5/2008 | Niimi | 501/127 |
| 7,375,046 | B2* | 5/2008 | Aihara et al. | 501/152 |
| 7,442,450 | B2* | 10/2008 | Aihara et al. | 428/698 |
| 2003/0029563 | A1 | 2/2003 | Kaushal et al. | |
| 2005/0068519 | A1 | 3/2005 | O'Meara et al. | |
| 2007/0042897 | A1 | 2/2007 | Aihara et al. | |
| 2007/0044716 | A1 | 3/2007 | Tetsuka et al. | |
| 2008/0207432 | A1* | 8/2008 | Hamada | 501/152 |
| 2009/0200523 | A1* | 8/2009 | Kobayashi et al. | 252/516 |

FOREIGN PATENT DOCUMENTS

| DE | 10 2006 000405 A1 | 2/2007 |
| EP | 0 552 635 A1 | 7/1993 |
| EP | 1 245 696 A1 | 10/2002 |
| JP | 01-219062 A1 | 9/1989 |
| JP | 07-033526 A1 | 2/1995 |
| JP | 07-033286 B2 | 4/1995 |
| JP | 07-315949 A1 | 12/1995 |
| JP | 11-278935 | 10/1999 |
| JP | 2001-179080 | 7/2001 |
| JP | 2006-069843 | 3/2006 |

* cited by examiner

*Primary Examiner*—Karl E Group
(74) *Attorney, Agent, or Firm*—Burr & Brown

(57) ABSTRACT

There is provided an yttrium oxide-containing material with excellent mechanical characteristics. The yttrium oxide-containing material becomes strong by adding silicon carbide (SiC) and yttrium fluoride ($YF_3$) to yttrium oxide ($Y_2O_3$). Accordingly, the yield, handling and reliability can be improved when this strengthened yttrium oxide-containing material is applied to and used for components of semiconductor manufacturing equipment.

15 Claims, 2 Drawing Sheets

YTTRIUM OXIDE-CONTAINING MATERIAL, COMPONENT OF SEMICONDUCTOR MANUFACTURING EQUIPMENT, AND METHOD OF PRODUCING YTTRIUM OXIDE-CONTAINING MATERIAL

CROSS REFERENCE TO RELATED APPLICATION

This application is based upon and claims the benefit of priority from the prior Japanese patent application No. 2007-062329 filed on Mar. 12, 2007, and the prior Japanese patent application No. 2008-46329 filed on Feb. 27, 2008, the entire contents of which are incorporated herein by reference.

BACKGROUND OF THE INVENTION

1. Field of the Invention

The present invention relates to an yttrium oxide containing material suitable for use for components of semiconductor manufacturing equipment.

2. Description of the Related Art

In general, components of semiconductor manufacturing equipment, such as a bell jar, chamber, susceptor, clamp ring, and focus ring, are often used in chemically corrosive atmospheres including a halogen-based gas atmosphere and a high-density plasma atmosphere. Against this background, an yttrium oxide-containing material, which has high corrosion resistance and is less liable to be a contaminant source, has been considered for use in forming those components of semiconductor manufacturing equipment, as disclosed in Japanese Unexamined Patent Application Publication Nos. 11-278935, 2001-179080, and 2006-69843.

A conventional yttrium oxide-containing material is, however, inferior in mechanical characteristics because the three-point bending strength thereof is about 140 to 180 MPa and the fracture toughness is about 0.8 to 1.1 MPa·m$^{1/2}$. Therefore, when the conventional yttrium oxide-containing material is applied to the components of semiconductor manufacturing equipment, those components can be broken when machined or used, which is disadvantageous in terms of yield, handing, and reliability.

The present invention has been made to solve the aforementioned problem, and an object thereof is to provide an yttrium oxide-containing material with excellent mechanical characteristics.

SUMMARY OF THE INVENTION

The inventors of the present invention have found as a result of their elaborate studies that the yttrium oxide-containing material becomes strong by adding silicon carbide (SiC) and yttrium fluoride ($YF_3$) to yttrium oxide ($Y_2O_3$) and that yield, handling, reliability can be improved accordingly when this strengthened yttrium oxide-containing material is applied to components of semiconductor manufacturing equipment.

According to the present invention, it is desirable that the grain diameter of silicon carbide in the yttrium oxide-containing material be 3 μm or less. In general, silicon carbide is characteristically much less corrosion-resistant to halogen-based plasma than yttrium oxide. Therefore, when the yttrium oxide containing material containing silicon carbide added thereto is exposed to halogen-based plasma, silicon carbide corrodes more readily than yttrium oxide, and cavities are thereby generated, which leads to formation of a difference in level whose depth is determined generally by the grain size of silicon carbide. Even when a sintered body of monolithic yttrium oxide is exposed to halogen-based plasma, a difference in level of about 2 μm is formed due to difference in corrosiveness attributed to various crystal orientations. The grain diameter of silicon carbide is, therefore, desirably 3 μm or less in order to keep the surface smoothness of the yttrium oxide-containing material even when silicon carbide is added thereto. Furthermore, deterioration of the strength of the yttrium oxide-containing material can be prevented with 3 μm or less grain diameter of silicon carbide.

Moreover, according to the present invention, it is desirable that the yttrium oxide-containing material is produced by sintering mixed powder of yttrium oxide, silicon carbide, and rare-earth fluoride at a sintering temperature between 1,300° C. and 1,850° C. Since the eutectic temperature of yttrium oxide and yttrium fluoride is 1,300° C., the sintering temperature of 1,300° C. or above produces a liquid phase and thereby sintering is activated, so it is expected that the yttrium oxide-containing material with a high density can be obtained. Furthermore, when the sintering temperature exceeds 1,850° C., the strength of the yttrium oxide-containing material is deteriorated because the grain growth of silicon carbide, YOF, and the like, occurs.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE INVENTION

Figure 1A:
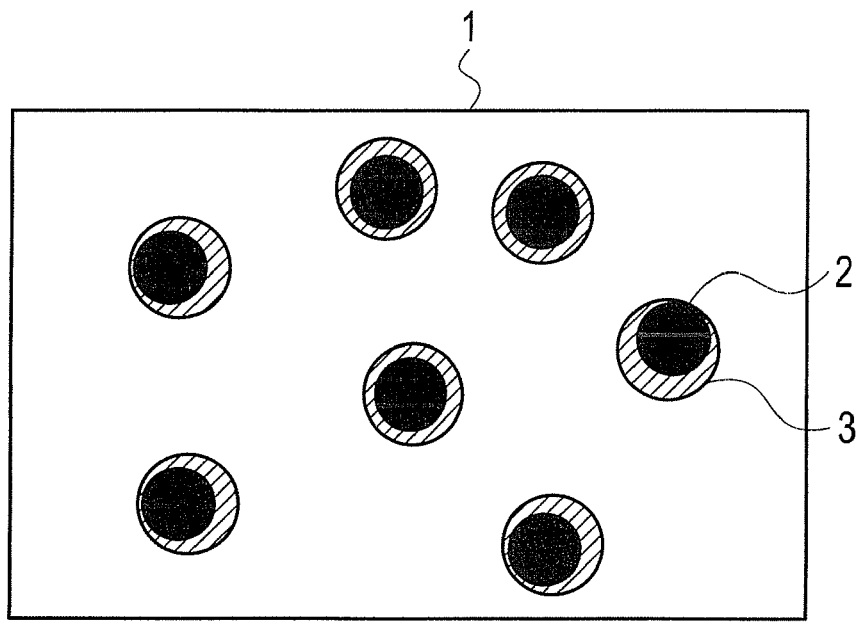
FIGS. 1A and 1B are a schematic diagram and an SEM photograph, respectively, showing a structure of yttrium oxide in the case that the amount of $SiO_2$ is larger than that of $YF_3$ involved in a reaction.

An yttrium oxide-containing material according to an embodiment of the present invention will be described below in detail, by comparison of strength, fracture toughness, and etching rate of the yttrium oxide-containing material between embodiment examples and comparative examples.

First Embodiment Example

In a first embodiment example, 96 vol. % yttrium oxide ($Y_2O_3$, prepared by Shin-Etsu Chemical, Co, Ltd., graded UUHP), 3 vol. % silicon carbide (SiC, prepared by Ibiden, Co., Ltd., Ultra-Fine), and 1 vol. % yttrium fluoride ($YF_3$, prepared by Kojundo Chemical Lab., Co., Ltd.) were mixed together, and thereafter the resultant mixture was wet-blended for 24 hours using an IPA (isopropyl alcohol) solvent (a ball mill utilizing a ZrO2 pebbles is used) to obtain slurry. The obtained slurry was sieved and then dried for 16 hours in a 110° C. nitrogen atmosphere, thereby obtaining powder. After the obtained dry powder was sieved, 80 g of the powder was formed into a body of 50 mm in diameter under a pressure of 200 kg/cm$^2$. At the end, hot press was applied to the formed body in a 1,600° C. argon-gas atmosphere with a pressure of 200 kg/cm², thereby obtaining an yttrium oxide-containing material in the first embodiment example.

Second Embodiment Example

In a second embodiment example, the same process as in the first embodiment example was performed, but the proportions of $Y_2O_3$, SiC, and $YF_3$ were 92 vol. %, 3 vol. %, and 5 vol. %, respectively, thereby obtaining an yttrium oxide-containing material in the second embodiment example.

Third Embodiment Example

In a third embodiment example, the same process as in the first embodiment example was performed, but the proportions of $Y_2O_3$, SiC, and $YF_3$ were 94 vol. %, 5 vol. %, and 1 vol. %, respectively, thereby obtaining an yttrium oxide-containing material in the third embodiment example.

Fourth Embodiment Example

In a fourth embodiment example, the same process as in the first embodiment example was performed, but the proportions of $Y_2O_3$, SiC, and $YF_3$ were 94 vol. %, 3 vol. %, and 3 vol. %, respectively, thereby obtaining an yttrium oxide-containing material in the fourth embodiment example.

Fifth Embodiment Example

In a fifth embodiment example, the same process as in the first embodiment example was performed, but the proportions of $Y_2O_3$, SiC, and $YF_3$ were 90 vol. %, 5 vol. %, and 5 vol. %, respectively, thereby obtaining an yttrium oxide-containing material in the fifth embodiment example.

Sixth Embodiment Example

In a sixth embodiment example, the same process as in the first embodiment example was performed, but the proportions of $Y_2O_3$, SiC, and $YF_3$ were 92 vol. %, 7 vol. %, and 1 vol. %, respectively, thereby obtaining an yttrium oxide-containing material in the sixth embodiment example.

Seventh Embodiment Example

In a seventh embodiment example, the same process as in the first embodiment example was performed, but the proportions of $Y_2O_3$, SiC, and $YF_3$ were 89 vol. %, 10 vol. %, and 1 vol. %, respectively, thereby obtaining an yttrium oxide-containing material in the seventh embodiment example.

Eighth Embodiment Example

In an eighth embodiment example, the same process as in the first embodiment example was performed, but the proportions of $Y_2O_3$, SiC, and $YF_3$ were 85 vol. %, 10 vol. %, and 5 vol. %, respectively, thereby obtaining an yttrium oxide containing material in the eighth embodiment example.

Ninth Embodiment Example

In a ninth embodiment example, the same process as in the first embodiment example was performed, but the proportions of $Y_2O_3$, SiC, and $YF_3$ were 86 vol. %, 13 vol. %, and 1 vol. %, respectively, thereby obtaining an yttrium oxide-containing material in the ninth embodiment example.

Tenth Embodiment Example

In a tenth embodiment example, the same process as in the first embodiment example was performed, but the proportions of $Y_2O_3$, SiC, and $YF_3$ were 82 vol. %, 13 vol. %, and 5 vol. %, respectively, thereby obtaining an yttrium oxide-containing material in the tenth embodiment example.

First Comparative Example

In a first comparative example, a sintered body was formed only using yttrium oxide ($Y_2O_3$, prepared by Shin-Etsu Chemical, Co., Ltd., graded UUHP).

Second Comparative Example

In a second comparative example, the same process as in the first embodiment example was performed, but the proportions of $Y_2O_3$ and $YF_3$ were 95 vol. % and 5 vol. %, respectively, thereby obtaining an yttrium oxide-containing material in the second comparative example.

Third Comparative Example

In a third comparative example, the same process as in the first embodiment example was performed, but the proportions of $Y_2O_3$, SiC, and $YF_3$ were 85 vol %, 5 vol. %, and 10 vol. %, respectively, thereby obtaining an yttrium oxide-containing material in the third comparative example.

Fourth Comparative Example

In a fourth comparative example, the same process as in the first embodiment example was performed, but the proportions of $Y_2O_3$, SiC, and $YF_3$ were 80 vol. %, 5 vol. %, and 15 vol. %, respectively, thereby obtaining an yttrium oxide-containing material in the fourth comparative example.

Fifth Comparative Example

In a fifth comparative example, the same process as in the first embodiment example was performed, but the proportions of $Y_2O_3$ and SiC were 80 vol. % and 20 vol. %, respectively, thereby obtaining an yttrium oxide-containing material in the fifth comparative example.

[Identification of Crystalline Phase]

By using an x-ray diffractometer (rotating-target x-ray diffractometer (RINT of Rigaku Corporation), CuKα radiation, 50 kV, 300 mA, 2θ=10° to 70°), crystalline phases were identified based on x-ray diffraction patterns obtained from each yttrium oxide-containing material of the first to the tenth embodiment examples and of the first to the fifth comparative examples. As a result, as shown in the following table 1, the yttrium oxide-containing materials in the first, the third, the sixth, the seventh, and the ninth embodiment examples and in the fifth comparative example were found to be composed of yttrium oxide, ($Y_2O_3$), silicon carbide (SiC), and $Y_2SiO_5$, and the yttrium oxide-containing materials in the second, the fifth, the eighth, and the tenth embodiment examples and in the third and the fourth comparative examples were found to be composed of $Y_2O_3$, SiC, and YOF. Furthermore, the yttrium oxide-containing material in the fourth embodiment example was found to be composed of $Y_2O_3$ and SiC.

TABLE 1

| | PREPARED COMPOSITION (vol %) | | | PREPARED COMPOSITION (mol %) | | | CRYSTALLINE PHASE |
|---|---|---|---|---|---|---|---|
| | Y2O3 | SiC | YF3 | Y2O3 | SiC | YF3 | |
| EMBODIMENT EXAMPLE 1 | 96 | 3 | 1 | 88.6 | 10.0 | 1.4 | Y2O3, SiC, Y2SiO5 |
| EMBODIMENT EXAMPLE 2 | 92 | 3 | 5 | 83.1 | 9.8 | 7.0 | Y2O3, SiC, YOF |
| EMBODIMENT EXAMPLE 3 | 94 | 5 | 1 | 82.7 | 15.9 | 1.4 | Y2O3, SiC, Y2SiO5 |
| EMBODIMENT EXAMPLE 4 | 94 | 3 | 3 | 85.8 | 9.9 | 4.3 | Y2O3, SiC |
| EMBODIMENT EXAMPLE 5 | 90 | 5 | 5 | 77.7 | 15.6 | 6.7 | Y2O3, SiC, YOF |
| EMBODIMENT EXAMPLE 6 | 92 | 7 | 1 | 77.4 | 21.3 | 1.3 | Y2O3, SiC, Y2SiO5 |
| EMBODIMENT EXAMPLE 7 | 89 | 10 | 1 | 70.2 | 28.5 | 1.2 | Y2O3, SiC, Y2SiO5 |
| EMBODIMENT EXAMPLE 8 | 85 | 10 | 5 | 65.9 | 28.0 | 6.0 | Y2O3, SiC, YOF |
| EMBODIMENT EXAMPLE 9 | 86 | 13 | 1 | 63.9 | 34.9 | 1.2 | Y2O3, SiC, Y2SiO5 |
| EMBODIMENT EXAMPLE 10 | 82 | 13 | 5 | 59.9 | 34.4 | 5.7 | Y2O3, SiC, YOF |
| COMPARATIVE EXAMPLE 1 | 100 | 0 | 0 | 100.0 | 0.0 | 0.0 | Y2O3 |
| COMPARATIVE EXAMPLE 2 | 95 | 0 | 5 | 92.4 | 0.0 | 7.6 | Y2O3, YOF |
| COMPARATIVE EXAMPLE 3 | 85 | 5 | 10 | 71.6 | 15.2 | 13.1 | Y2O3, SiC, YOF |
| COMPARATIVE EXAMPLE 4 | 80 | 5 | 15 | 65.9 | 14.9 | 19.3 | Y2O3, SiC, YOF |
| COMPARATIVE EXAMPLE 5 | 80 | 20 | 0 | 52.5 | 47.5 | 0.0 | Y2O3, SiC, Y2SiO5 |

| | SiC AVERAGE GRAIN (μm) | TOF AVERAGE GRAIN (μm) | STRENGTH (MPa) | FRACTURE TOUGHNESS (MPa√m) | ETCHING RATE (nm/h) |
|---|---|---|---|---|---|
| EMBODIMENT EXAMPLE 1 | 1.2 | — | 260 | 1.3 | 249 |
| EMBODIMENT EXAMPLE 2 | 0.9 | 2 | 250 | 1.5 | 252 |
| EMBODIMENT EXAMPLE 3 | 1.3 | — | 280 | 1.4 | 256 |
| EMBODIMENT EXAMPLE 4 | 1.2 | — | 300 | 1.5 | 259 |
| EMBODIMENT EXAMPLE 5 | 1.2 | 3 | 270 | 1.6 | 258 |
| EMBODIMENT EXAMPLE 6 | 1.5 | — | 320 | 1.5 | 272 |
| EMBODIMENT EXAMPLE 7 | 1.6 | — | 340 | 1.6 | 289 |
| EMBODIMENT EXAMPLE 8 | 1.3 | 5 | 320 | 1.9 | 269 |
| EMBODIMENT EXAMPLE 9 | 1.6 | — | 330 | 2.1 | 296 |
| EMBODIMENT EXAMPLE 10 | 1.3 | 4 | 300 | 2.2 | 271 |
| COMPARATIVE EXAMPLE 1 | — | — | 220 | 1.0 | 243 |
| COMPARATIVE EXAMPLE 2 | — | 45 | 200 | 1.2 | 242 |
| COMPARATIVE EXAMPLE 3 | 1.1 | 15 | 220 | 1.6 | 254 |
| COMPARATIVE EXAMPLE 4 | 0.9 | 33 | 210 | 1.5 | 252 |
| COMPARATIVE EXAMPLE 5 | 1.8 | — | 230 | 2.2 | 389 |

Figure 1B:
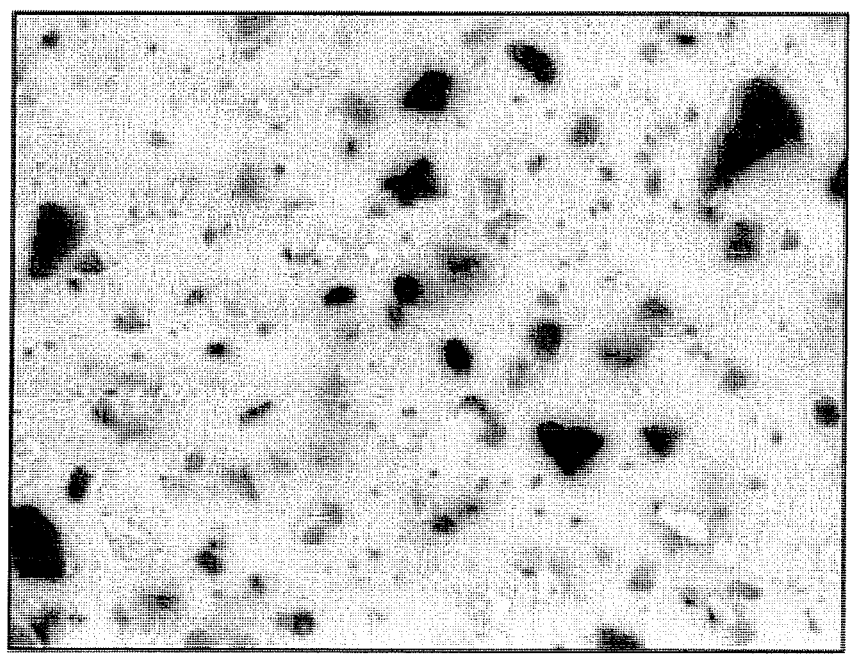

Furthermore, the chemical structures of the yttrium oxide-containing materials in the first to the tenth embodiment examples were analyzed. As a result, it became clear that, when a small amount of $YF_3$ was added (1 vol. % in the embodiment examples) and thus the amount of $SiO_2$ was larger than that of $YF_3$ involved in chemical reactions, silicon carbide grains 2 included in $Y_2SiO_5$ materials 3 were dispersed in an yttrium-oxide basal body 1 as shown in FIGS. 1A and 1B, because reactions expressed by the following chemical formulas 1 and 2 proceeded.

$$3SiO_2 + 4YF_3 \rightarrow 3SiF_4\uparrow + 2Y_2O_3 \qquad \text{[Chemical Formula 1]}$$

$$SiO_2 + Y_2O_3 \rightarrow Y_2SiO_5 \qquad \text{[Chemical Formula 2]}$$

Figure 2A:
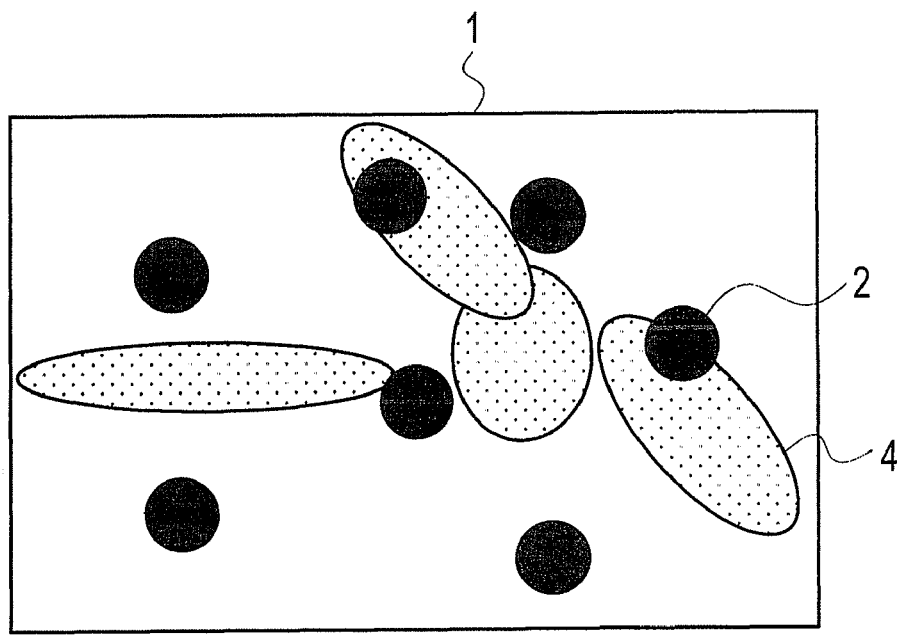
FIGS. 2A and 2B are a schematic diagram and an SEM photograph, respectively, showing a structure of yttrium oxide in the case that the amount of $SiO_2$ is less than that of $YF_3$ involved in the reaction.
Figure 2B:
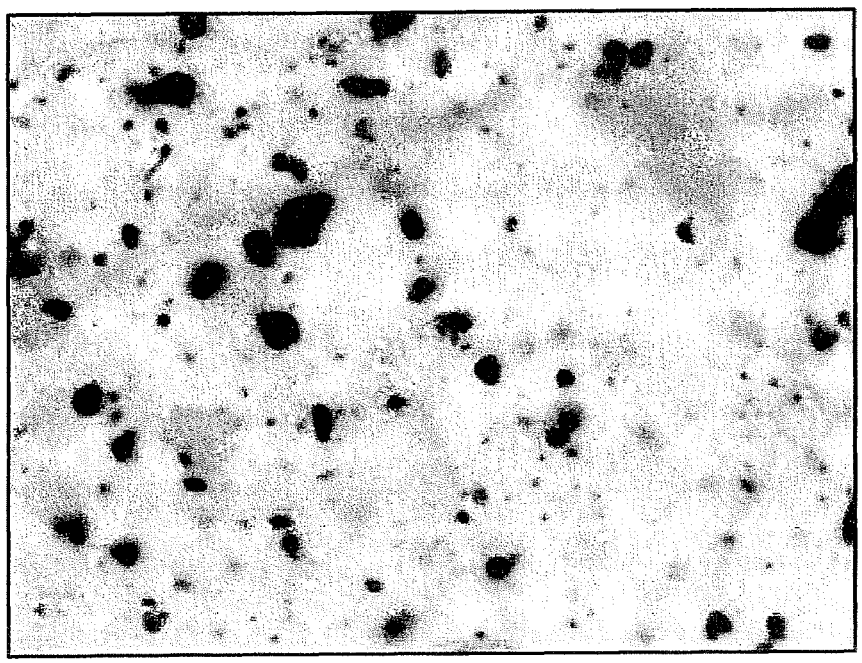

In contrast, when a large amount of $YF_3$ was added (5 vol. % in the embodiment examples) and the amount of $SiO_2$ was smaller than that of $YF_3$ involved in the chemical reactions, it became clear that the silicon carbide grains 2 were dispersed in the yttrium-oxide basal body 1 and an YOF region 4 was formed between the silicon carbide particles 2 as shown in FIGS. 2A and 2B, because the reaction expressed by the aforementioned chemical formula 1 and another reaction expressed by the following chemical formula 3 proceeds.

$$Y_2O_3 + YF_3 \rightarrow 3YOF \qquad \text{[Chemical Formula 3]}$$

Moreover, the average grain diameter of SiC in each yttrium oxide-containing material of the first to the tenth embodiment examples and of the third to the fifth comparative examples was examined by SEM photographs. As a result, the average grain diameter of SiC was found to be 3 μm or less. Furthermore, the average grain diameter of YOF in each yttrium oxide-containing material of the second, the fifth, the eighth, and the tenth embodiment examples and of the second to the fourth comparative examples was examined by SEM photographs. As a result, the average grain diameter of YOF of the second, the fifth, the eighth, and the tenth embodiment examples was found to be 10 μm or less.

[Measurement of SiC Average Grain Diameter]

The yttrium oxide-containing materials in the first to the tenth embodiment examples and in the third to the fifth comparative examples were observed using backscattered electron images of an SEM for measurement of the average grain diameter of SiC in each yttrium oxide-containing material. As SiC grains smaller than 0.5 μm in diameter could not be measured accurately, a minor diameter of only grains of 0.50 μm or greater in diameter was measured, and an average value thereof was determined as an average grain diameter. As a result, the average grain diameter of SiC in any yttrium oxide-containing materials was found to be 2 μm or less. Also, comparatively large SiC grains, which are 0.5 μm or greater, existed mainly at a grain boundary. Although fine SiC grains of 0.5 μm or less could not be measured accurately, an SiC abundance ratio was found different depending on whether $YF_3$ was added or not. Specifically, when $YF_3$ was added, a number of fine SiC grains were observed within the yttrium oxide grains. In contrast, when $YF_3$ was not added, fine SiC grains were hardly observed. The reason for this is not yet clear at present, but it is conceivable that the addition of YF$_3$ enables low-temperature sintering and thereby fine SiC grains can stay stably, and also that the SiC grains are easily included in the yttrium oxide grains.

[Evaluation of Strength]

For each yttrium oxide-containing material of the first to the tenth embodiment examples and of the first to the fifth comparative examples, three-point bending strength was measured by a three-point bending test. The measurement result is shown in Table 1. As a result, the yttrium oxide-containing materials of the first to the tenth embodiment examples had three-point strength of 250 MPa or higher.

[Evaluation of Fracture Toughness]

For each yttrium oxide-containing material of the first to the tenth embodiment examples and of the first to the fifth comparative examples, fracture toughness was measured according to IF method (weight: 9.8N) in conformity to JIS_R_1607. The measurement result is shown in Table 1. As a result, the yttrium oxide-containing materials of the first to the tenth embodiment examples had fracture toughness of 1.3 MPa·m$^{1/2}$ or higher. Furthermore, the materials containing YF$_3$ had a tendency to have higher strength and fracture toughness even with a small amount of SiC. The reason for this is not yet clear at present time, but it is conceivable that the addition of YF$_3$ leads to the fact that comparatively large SiC grains of 0.5 μm or greater exist at the grain boundary of yttrium oxide and that fine SiC grains smaller than 0.5 μm exist within the yttrium oxide grains, thereby resulting in effectively improved mechanical characteristics at the grain boundary and within the yttrium oxide grains.

[Evaluation of Etching Rate]

For each yttrium oxide-containing material of the first to the tenth embodiment examples and of the first to the fifth comparative examples, plasma-resistance test was performed using a corrosion resistance tester. Specifically, plasma was generated using gas containing NF$_3$, O$_2$, or Ar at 800 W of ICP power, and the generated plasma was applied to a test piece at 300 W bias power. Subsequently, an etching rate of each yttrium oxide-containing material was calculated by dividing a difference in level between a masked surface and an exposed surface by test duration. The calculation result is shown in Table 1. As a result, when the quantity, shape, dispersed state of the silicon carbide met certain conditions, the corrosion resistance of the yttrium oxide-containing material was not greatly deteriorated even when poor corrosion-resistant silicon carbide was added to excellent corrosion-resistant yttrium oxide.

From the foregoing results, the yttrium oxide-containing materials in the embodiment examples were found to have high fracture toughness by the addition of silicon carbide, to have an improved sinterability by the addition of YF$_3$, and to be strengthened because the low-temperature sintering became possible. Note that, as the amount of added YF$_3$ is increased, the YOF grain diameter becomes larger and the strength is deteriorated accordingly. According to the yttrium oxide-containing materials in the embodiment examples, however, the YOF grain diameter is adjustable suitably.

[Evaluation of Room-Temperature Volume Resistivity and Relative Permittivity]

The room-temperature volume resistivity of each yttrium oxide-containing material in the first, the third, the sixth, the seventh, and the ninth embodiment examples and in the first comparative example was measured. The measurement of the volume resistivity was done in the atmosphere according to a method in conformity with JIS-C2141. The measurement of the relative permittivity was done by using a 4291A impedance analyzer after a surface of a plate-like sample 21 mm square and 0.1 mm in thickness had been polished to obtain a surface roughness of Ra=0.1 μm or less. The measurement result is shown in the following Table 2.

TABLE 2

| | SiC ADDITIVE AMOUNT (vol %) | VOLUME RESISTIVITY AT ROOM TEMPERATURE (Ω·cm) | RELATIVE PERMITTIVITY |
|---|---|---|---|
| EMBODIMENT EXAMPLE 1 | 3 | $10^{16}$ OR ABOVE | 16 |
| EMBODIMENT EXAMPLE 3 | 5 | $10^{16}$ OR ABOVE | 18.5 |
| EMBODIMENT EXAMPLE 6 | 7 | $10^{16}$ OR ABOVE | 18 |
| EMBODIMENT EXAMPLE 7 | 10 | $10^{16}$ OR ABOVE | 17.5 |
| EMBODIMENT EXAMPLE 9 | 13 | $3 \times 10^{13}$ | NON-MEASURABLE |
| COMPARATIVE EXAMPLE 1 | 0 | $10^{16}$ OR ABOVE | 12 |

As shown in Table 2, when the amount of added SiC was within the range of 0 to 10 vol. %, the room-temperature volume resistivity was $10^{16}$ Ω·cm or above, which means that the yttrium oxide-containing material maintains high resistivity. When the amount of added SiC was 13 vol. %, the room-temperature volume resistivity is $3 \times 10^{13}$ Ω·cm, which means the yttrium oxide-containing material exhibits low resistivity. When no SiC was added, the relative permittivity of the yttrium oxide-containing material was 12, but when the amount of added SiC was within the range of 3 to 10 vol %, the relative permittivity of the yttrium oxide-containing material was 16 to 18.5, which was comparatively high values. From the foregoing results, it became clear that the SiC addition within the range of 3 to 10 vol. % maintained high volume resistivity as well as increased the relative permittivity of the yttrium oxide-containing material.

Note that Japanese Unexamined Patent Application Publication No. 2006-69843 discloses the invention of imparting conductivity to an yttrium oxide-containing material by adding SiC thereto within the range of 2 to 30 wt.%. In contrast, the present invention maintains high volume resistivity and increases the relative permittivity of the yttrium oxide-containing material by adding 3 to 10 vol.% of SiC thereto. In general, a coulomb-type electrostatic chuck requires a volume resistivity of $10^{15}$ Ω·cm or above in order to chuck a wafer. Furthermore, the chucking force of the electrostatic chuck is expressed by the following equation (1), and becomes larger as the relative permittivity is increased with the same dielectric thickness at the same applied voltage. Alternatively, the dielectric can be thickened in order to obtain an equivalent chucking force at the same applied voltage. Therefore, according to the present invention, when the yttrium oxide-containing material, which is inferior in mechanical characteristics, is applied to a component of semiconductor manufacturing equipment, the component can be thickened, so that the reliability of the mechanical characteristics can be enhanced.

$$F=(1/2) \times \in^2 \times \in_0 \times (V/d)^2 \quad (1)$$

F denotes an chucking force, $\in$ denotes a relative permittivity, $\in_0$ denotes an electric constant, V denotes an applied voltage, and d denotes a thickness of the dielectric (yttrium oxide-containing material).

The reason why the conductivity is different between the present invention and the invention disclosed in Japanese Unexamined Patent Application Publication No. 2006-69843 both in which SiC is added likewise, is not yet clear at present time, but this is probably due to the difference between SiC and yttrium oxide in grain diameters thereof and in how easy the grain growth promotes. Specifically, generally speaking, when the conductivity is imparted to an insulator by adding conductive grains thereto, the bigger the grain diameter of the matrix insulator, and conversely, the smaller the grain diameter of the conductive grains, the smaller the amount of the conductive grains to be added. According to the invention disclosed in Japanese Unexamined Patent Application Publication No. 2006-69843, SiC grains having a small grain diameter and yttrium oxide powder having a large grain diameter are used. In contrast, according to the present invention, SiC grains having a comparatively large grain diameter and yttrium oxide grains having a small grain diameter are used for enhancement of the mechanical characteristics. In general, when SiC is added to yttrium oxide, the sinterability is prevented, and hence high sintering temperature is required, which resultantly promotes the grain growth. Furthermore, the grain growth of yttrium oxide promotes much more readily than SiC during sintering. From these reasons, it is probable that the conductivity emerges easily in the invention disclosed in Japanese Unexamined Patent Application Publication No. 2006-69843. In contrast, in the present invention, low-temperature sintering becomes possible by the addition of $YF_3$, so that the grain growth of yttrium oxide can be suppressed. Moreover, fine SiC grains of about 0.5 μm or less in diameter are included in yttrium oxide grains, so that there is probably no conductivity.

Although the present invention made by the present inventors has been described in reference to its embodiment, the statement and drawings constituting part of the disclosure of the present invention should not be regarded as limiting the present invention. For example, yttrium fluoride is contained in yttrium oxide in the foregoing embodiment, but rare-earth fluoride other than yttrium fluoride, such as Lanthanum Fluoride and Ytterbium Fluoride, is also available. As described, various alternative embodiments, examples, and operation techniques made by those skilled in the art on the basis of the foregoing embodiment are, of course, within the scope of the present invention.

What is claimed is:

1. An yttrium oxide-containing material comprising:
   silicon (Si), carbon (C), and fluorine (F),
   wherein Si and C are contained in terms of 9.8 to 34.9 mol % of SiC,
   F is contained in terms of 1.2 to 7.0 mol % of $YF_3$, and
   Y is contained in terms of 59.9 to 88.6 mol % of $Y_2O_3$, wherein Y is obtained by subtracting the number of moles of $YF_3$ from the number of moles of Y.

2. The yttrium oxide-containing material according to claim 1, wherein a crystalline phase is composed of yttrium oxide ($Y_2O_3$) and silicon carbide (SiC).

3. The yttrium oxide-containing material according to claim 1, wherein a crystalline phase is composed of yttrium oxide ($Y_2O_3$), silicon carbide (SiC), and at least one of a compound of $SiO_2$ and $Re_2O_3$ (Re is a rare-earth element) and a compound of $YF_3$ and $Re_2O_3$.

4. The yttrium oxide-containing material according to claim 3, wherein the compound of $SiO_2$ and $Re_2O_3$ is $ReSiO_5$, and the compound of $YF_3$ and $Re_2O_3$ is ReOF.

5. The yttrium oxide-containing material according to claim 4, the rare-earth element is yttrium (Y).

6. The yttrium oxide-containing material according to claim 5, wherein a grain diameter of the silicon carbide is 3 μm or less.

7. The yttrium oxide-containing material according to claim 5, wherein a grain diameter of the YOF is 10 μm or less.

8. The yttrium oxide-containing material according to claim 1, wherein three-point bending strength is 250 MPa or above.

9. The yttrium-oxide containing material according to claim 1, wherein fracture toughness is 1.3 MPa·m$^{1/2}$ or above.

10. The yttrium oxide-containing material according to claim 1, wherein porosity is 5% or below.

11. The yttrium oxide-containing material according to claim 1, wherein room-temperature volume resistivity is $1 \times 10^{15}$ Ω·cm or above.

12. The yttrium oxide-containing material according to claim 1, wherein a relative permittivity is within a range of 16 to 20.

13. A component of semiconductor manufacturing equipment, wherein at least a portion of the component is made of the yttrium oxide-containing material according to claim 1.

14. A method of producing the yttrium oxide-containing material according to claim 1, comprising:
   a step of sintering mixed powder of yttrium oxide, silicon carbide, and rare-earth fluoride at a. temperature between 1,300° C. and 1,850° C.

15. The method of producing the yttrium oxide-containing material according to claim 14, wherein the rare-earth fluoride is yttrium fluoride ($YF_3$).

* * * * *